(12) United States Patent
Padmanabhan et al.

(10) Patent No.: US 8,723,238 B1
(45) Date of Patent: May 13, 2014

(54) METHOD OF FORMING A TRANSISTOR AND STRUCTURE THEREFOR

(71) Applicants: Balaji Padmanabhan, Tempe, AZ (US); Prasad Venkatraman, Gilbert, AZ (US); Gordon M. Grivna, Mesa, AZ (US)

(72) Inventors: Balaji Padmanabhan, Tempe, AZ (US); Prasad Venkatraman, Gilbert, AZ (US); Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/831,887

(22) Filed: Mar. 15, 2013

(51) Int. Cl.
*H01L 29/76* (2006.01)

(52) U.S. Cl.
USPC .......... 257/288; 438/270; 257/E29.262; 257/E21.41; 257/330

(58) Field of Classification Search
USPC ............................................ 257/288, 330
See application file for complete search history.

(56) References Cited

U.S. PATENT DOCUMENTS

| | | | |
|---|---|---|---|
| 5,012,305 A * | 4/1991 | Khadder et al. | 257/270 |
| 6,906,380 B1 | 6/2005 | Pattanayak | |
| 7,282,406 B2 | 10/2007 | Grivna | |
| 7,633,120 B2 | 12/2009 | Hebert | |
| 7,667,242 B1 * | 2/2010 | Veliadis et al. | 257/127 |
| 8,304,314 B2 | 11/2012 | Pearse | |
| 2006/0113589 A1 | 6/2006 | Jones | |
| 2008/0309382 A1 * | 12/2008 | Bhalla et al. | 327/110 |
| 2012/0313161 A1 * | 12/2012 | Grivna et al. | 257/330 |

OTHER PUBLICATIONS

Francine Robb, et al., A New P-Channel Bidirectional Trench Power MOSFET for Battery Charging and Protection, Proceedings of The 22nd International Symposium on Power Semiconductor Devices & ICs, 405-408.

* cited by examiner

*Primary Examiner* — Bilkis Jahan
(74) *Attorney, Agent, or Firm* — Robert F. Hightower

(57) ABSTRACT

In one embodiment, a semiconductor device is formed to include a gate structure extending into a first portion of a semiconductor material that is underlying a first region of semiconductor material. The gate structure separates a portion of the first region into at least a first current carrying electrode region and a second current carrying electrode region. The first portion of the semiconductor material is configured to form a channel region of the transistor which underlies a gate conductor of the gate structure. The gate structure also includes a shield conductor overlying the gate conductor and having a shield insulator positioned between the shield conductor and the gate conductor. The shield insulator also having a second portion positioned between the shield conductor and a second portion of the gate insulator and a third portion overlying the shield conductor.

20 Claims, 7 Drawing Sheets

METHOD OF FORMING A TRANSISTOR AND STRUCTURE THEREFOR

The present application is related to U.S. patent application Ser. No. 13/590,947 entitled BIDIRECTIONAL FIELD EFFECT TRANSISTOR AND METHOD, a common inventor, and a common assignee, and which is hereby incorporated herein by reference. The present application is related to a U.S. patent application having Ser. No. 13/831,883 having common inventors Balaji Padmanabhan et al. and a common assignee, which is filed concurrently herewith and which is hereby incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various structures and methods to form transistors that could conduct current in both directions through the transistor. Such transistors often were referred to as bi-directional transistors or bi-directional field effect transistor (FETs). Some bi-FETs were vertical current flow transistors such as a vertical power transistor. Often, the bi-FETs had a low switching frequency which limited the applications for the bi-FETs. Additionally, the breakdown voltage typically was low, especially in one direction. Furthermore, the process flow was complex which increased the manufacturing cost.

Accordingly, it is desirable to have a bi-directional transistor that has a higher switching frequency, that has a better breakdown voltage characteristic, and that has a lower cost.

Figure 1:
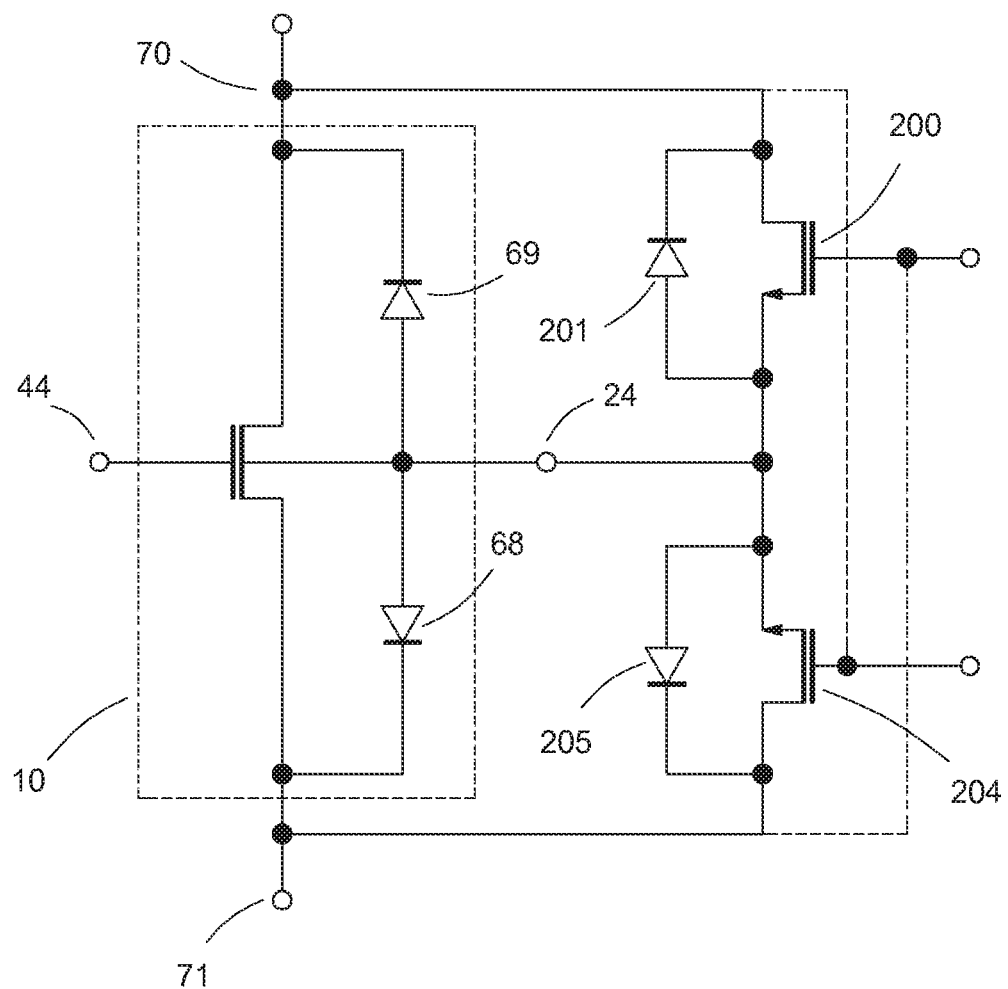
FIG. 1 illustrates a circuit representation of a portion of an embodiment of an MOS transistor in accordance with the present invention.

For simplicity and clarity of the illustration(s), elements in the figures are not necessarily to scale, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of a MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type of N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

FIG. 1 illustrates a circuit representation of a bi-directional transistor 10 connected in an example of an application that may use transistor 10. Transistor 10 is formed to conduct current in both directions through transistor 10 and to block reverse voltages in both directions across transistor 10. Transistor 10 includes a control terminal 44 that is configured to provide connection to a control electrode or gate of transistor 10. A body terminal 24 of transistor 10 is electrically connected to a body region of transistor 10. As will be seen further hereinafter, the body region or body of transistor 10 is electrically isolated from both current carrying electrodes of transistor 10. Terminal 24 is provided as an external terminal of transistor 10 to facilitate connecting external switches for bi-directional operation of transistor 10. The source of a transistor typically is the electrode connected to the body of the transistor. Because the body of transistor 10 is not directly connected to either the source or the drain of transistor 10, it is not clear in the circuit schematic representation of transistor 10 which current carrying electrode of transistor 10 is identified as the source or the drain of transistor 10. For example, the body may be isolated by body diodes 68-69.

Consequently, these are referred to as current carrying electrodes (CCE). A first carrying electrode (CCE1) of transistor 10 is connected to a first current terminal 70 of transistor 10, and a second carrying electrode (CCE2) of transistor 10 is connected to a second current terminal 71. The first and second current carrying electrodes (CCE1 and CCE2) can function as either the source or drain of transistor 10 based on the bias voltage applied thereto as will be seen further hereinafter.

The example application connection circuit illustrated in FIG. 1 includes a first switch or first switch transistor 200, and a second switch or second switch transistor 204 that facilitate operating transistor 10 as a bi-directional switch to conduct current in both directions through transistor 10. A parasitic source-drain diode of transistor 200 is illustrated by a diode 201, and a parasitic source-drain diode of transistor 204 is illustrated by a diode 205. Parasitic body diodes of transistor 10 are illustrated by diodes 68-69.

Transistors 200 and 204 may be selectively enabled responsively to signals (not shown) applied to the gate electrodes of transistors 200 and 204. In an alternate embodiment, transistors 200 and 204 may be selectively enabled responsively to the signals that are applied on the first terminal and the second terminal of transistor 10 (as illustrated by dashed lines). An example of the operation of a bi-directional transistor is explained in U.S. Pat. No. 7,282,406 which is hereby incorporated herein by reference. Although transistor 10 is illustrated and described herein as an N-channel transistor, transistor 10 may also be implemented as an P-channel transistor.

Figure 2:
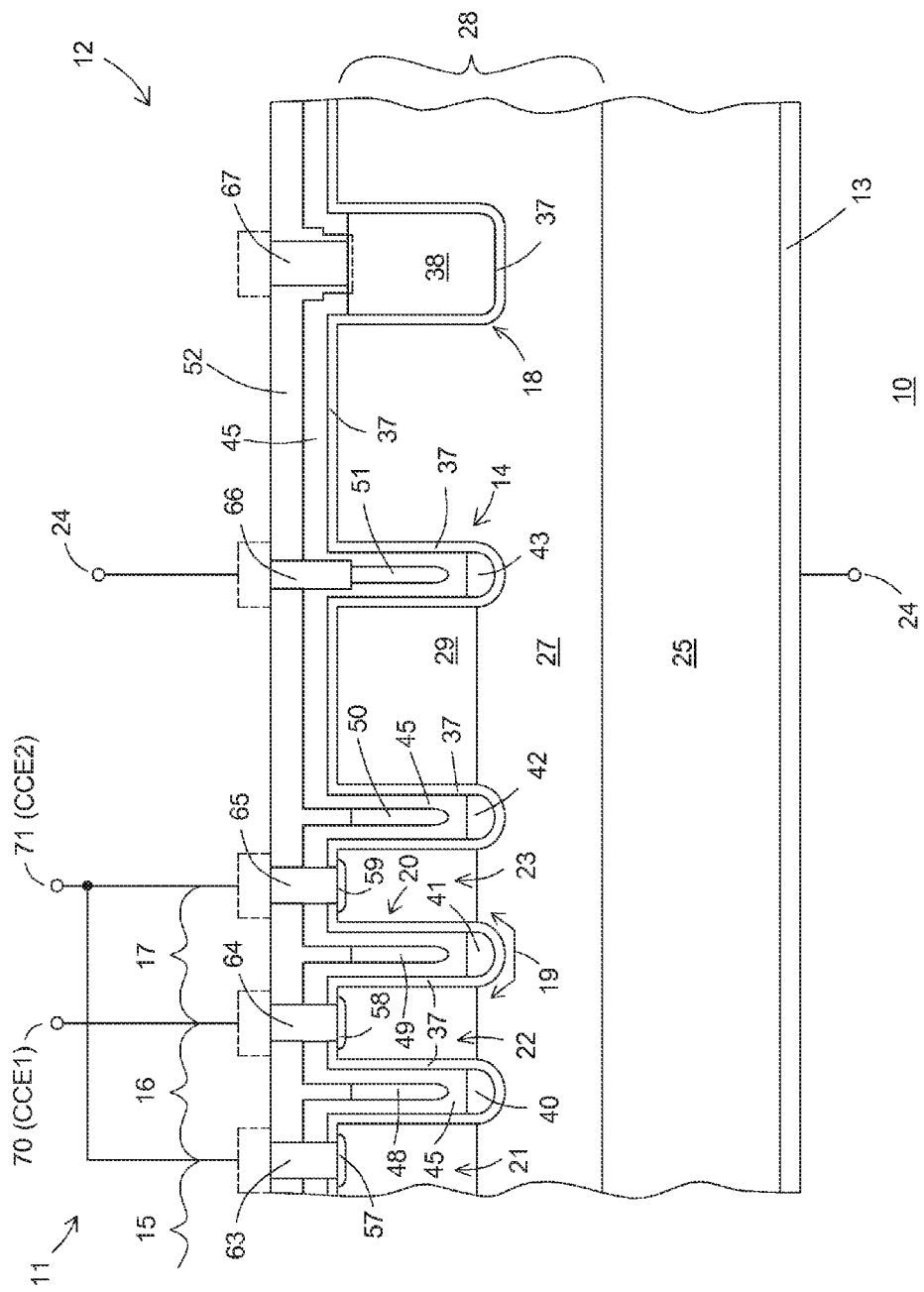
FIG. 2 schematically illustrates a reduced cross-sectional view of an example of a portion of an embodiment of a semiconductor device in accordance with the present invention.

FIG. 2 schematically illustrates an enlarged cross-sectional view of an example of a portion of an embodiment of a semiconductor device, such as transistor 10. Typically, transistor 10 includes an active region 11 and a termination region 12 that are illustrated in a general manner by arrows. A plurality of transistor cells are formed in the active region and are interconnected together to function as one transistor. Examples of the transistor cells are illustrated by transistor cells 15-17. Although the descriptions hereinafter may focus attention on cells 16-17 and the nearby material, this is done for clarity of the descriptions and those skilled in the art will appreciate that the descriptions also apply to other cells of transistor 10 such as cell 15 and an adjacent cell (not shown) that may be positioned to the left of cell 15.

Transistor 10 includes a plurality of current carrying electrodes (CCE), such as illustrated by regions 21-23, that function as the drain or source regions of transistor 10 depending on the voltages applied to the CCEs, such as CCE1 and CCE2. Since transistor 10 is a lateral transistor, each cell shares a CCE with an adjacent cell. As will be seen further hereinafter, each of cells 15-17 include a portion of a first current carrying electrode (CCE1), such as a region 22 for example, and a portion of a second current carrying electrode (CCE2), such as one of regions 21 and 23 for example. Those skilled in the art will understand that either of regions 21-23 may be the source or drain region depending on the voltage applied to the respective regions. For example, if transistor 10 is biased such that CCE1 (connected to terminal 70) is the source electrode and CCE2 (connected to terminal 71) is the drain electrode, then the source current carrying electrode (source CCE) of cell 16, such as a region 22 for example, functions as a source current carrying electrode (source CCE) for both of cells 16 and 17, and the drain current carrying electrode (drain CCE) of cells 15 and 17, such as a regions 21 and 23 for example, function as the drain current carrying electrode (drain CCE) for both cell 16.

Each of cells 15-17 also include a gate structure, such as a gate structure 20 of cell 17 which is illustrated in a general manner by an arrow. Each gate structure, such as gate structure 20 for example, includes a shield conductor or shield, such as shields 48-50, overlying a gate conductor or gate, such as respective gates 40-42, with a shield insulator 45 insulating each shield from the corresponding underlying gate. A portion of the semiconductor material underlying gates 40-41 of cells 16-17 is configured to form a channel region of each cell, thus a channel region of transistor 10, such as a channel region 19 which is illustrated in a general manner by an arrow. The channel region of each cell underlies the corresponding gate, such as channel region 19 underlying gate 41, so that current flows laterally through the channel region, as illustrated in a general manner by arrow 19, between the CCE of one cell and the CCE of an adjacent cell.

Cells 15-17 typically are formed in long stripes that would extend perpendicular to the plane of the page of FIG. 1. Cells 15-17 may have other shapes in other embodiments such as a circular shape or other geometric shape. As is well known in the art, each of cells 15-17 function as a small transistor and are interconnected together to form one large transistor.

Transistor 10 may also include a shield contact structure 14 that is formed in region 12 near a boundary with region 11. In the preferred embodiment, one side of structure 14 abuts region 29, in other embodiments, structure 14 may be spaced apart from region 29. A gate contact structure 18 of transistor 10 typically is formed in termination region 12. In one embodiment, shield contact structure 14 includes a gate 43, a shield conductor 51, and shield insulator 45 that are formed similarly to respective gates 40-42, shields 48-50, and insulator 45 of cells 15-17. Shield contact structure 14 may extend out of the plane of the page of FIG. 2 and at some point shield 51 may extend laterally to make an electrical connection to all of shields 48-50 to form a common electrical connection thereto. In some embodiments, shield 51 also forms an electrical connection to the body region portion of layer 27 such as along the lateral extension of shield 51. Those skilled in the art will understand that in most embodiments, gate contact structure 18 does not extend out of the plane of the page of FIG. 2 but that the illustrated view of structure 18 is at a point typically at the end of the trenches of gate structures 14. In other embodiments, there may be multiple versions of structure 18. The material of individual gates 40-43 typically are electrically connected to material 38 of structure 18 at some point, and gates 40-43 are later connected to each other such as by metal connections or by other conductors such as doped polysilicon. In some embodiments, an additional optional conductor 13 may be applied to a second surface of a substrate 25 of transistor 10. Conductor 13 may be used to form a connection to terminal 24. In some embodiments, conductor 13 may be omitted. In other embodiments, shield 51 may be connected to terminal 24 and to region 27 within a package that encapsulates transistor 10 in order to form a connection to the body of transistor 10.

FIG. 3-FIG. 6 illustrate various stages in portions of an example of an embodiment of a method of forming transistor 10. These descriptions have references to FIG. 1-FIG. 6.

Figure 3:
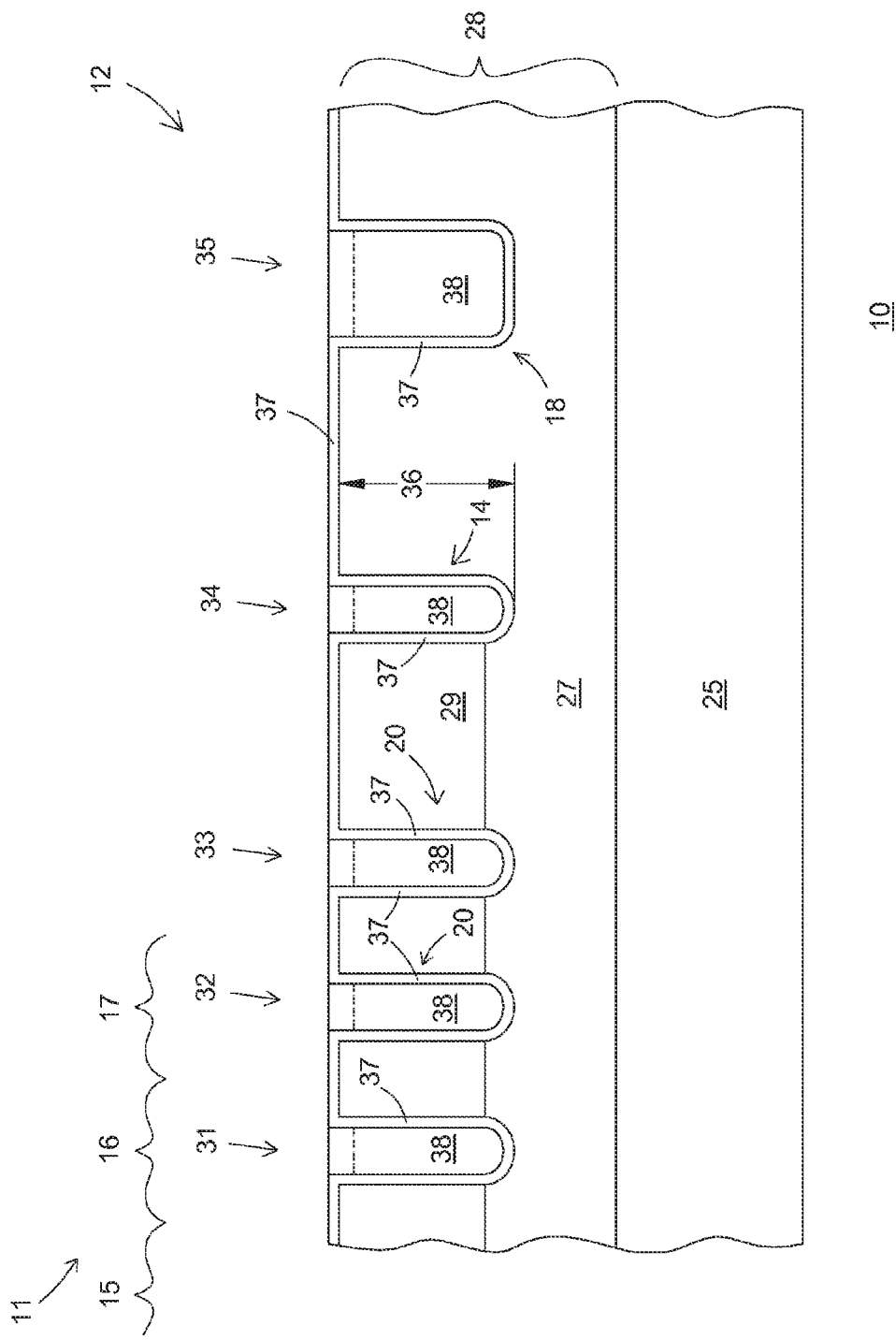
FIG. 3-FIG. 6 illustrates various stages in portions of an example of an embodiment of a method of forming the semiconductor device of FIG. 2 in accordance with the present invention.

Turning to FIG. 3, transistor 10 includes a semiconductor substrate 25 which typically has a high doping concentration. A layer 28 of semiconductor material is formed on substrate 25. One example of forming layer 28 of semiconductor material on substrate 25 includes forming an epitaxial layer 27 on one surface or a first surface of substrate 25. In one embodiment, substrate 25 may be highly doped P-type material and layer 27 may be P-type material which forms a body region for transistor 10. In another embodiment, substrate 25 and layer 27 may be a multi-layer semiconductor material. In another embodiment, substrate 25 may be N-type material and layer 27 may be lightly doped P-type material. For such an embodiment, an additional heavily doped P-type layer may be formed on substrate 25 prior to forming layer 27. In such a case, the layer of semiconductor material 28 may include both P-type layers.

Openings 31-35 are formed to extend from a surface of layer 27 a distance 36 into layer 27. Distance 36 usually is chosen so that openings 31-34 extend through a semiconductor region 29 which may subsequently be formed. Openings 31-35 may be formed by a variety of methods including applying and patterning a mask, not shown, on layer 27 and etching openings into the material of layer 27. Although the descriptions of the methods herein may focus attention on openings 31-33 and the nearby material, this is done for clarity of the descriptions and those skilled in the art will appreciate that the descriptions also apply to other cells of transistor 10 such as cell 15 and an un-shown adjacent cell that may be positioned to the left of cell 15.

A gate insulator 37 is formed along the bottom and at least a portion of the sidewalls of the openings. In another embodiment, insulator 37 is formed along all of the sidewall of the opening and also on the surface of layer 27. Insulator 37 may be formed by a variety of methods. For example, the mask may be removed after forming openings 31-35 and the exposed silicon surface may be oxidized or insulator 37 may be formed by deposition or other techniques. In another example, a portion of insulator 37 may formed by oxidizing and another portion may be formed by depositing.

A conductor material 38 is formed within openings 31-35. A portion of this conductor material will eventually form gates 40-43 within openings 31-34. Typically, openings 31-35 are filled with a doped polysilicon material. In other embodiments, a different conductor material may be used such as a silicide or a metal conductor.

In one embodiment, a portion of material 38 is removed from opening 35 so that the top of material 38 is recessed slightly below the surface of layer 27 as illustrated by a dashed line. In other embodiments, a portion of material 38 may be removed from all of openings 31-35 so that the top of material 38 is recessed in all of openings 31-35 as illustrated by dashed lines. In one embodiment, the portion of material 38 may be removed by applying and patterning a mask, and etching the exposed portions of material 38.

Thereafter, semiconductor region 29 may be formed between the openings that are in active region 11 of transistor 10, such as between openings 31-34. Portions of region 29 will eventually form the source/drain CCE regions of the cells, thus, the source/drain CCE regions of transistor 10. Region 29 may be formed by a variety of methods. In the preferred embodiment, a portion of layer 27 is doped in order to form region 29 within a portion of layer 27. In the preferred embodiment, region 29 is an N-type region.

In an alternate embodiment, region 29 may be formed prior to forming openings 31-35. For example, an epitaxial layer may be grown on the surface of layer 27 with the desired conductivity type of region 29 and a portion of the epitaxial layer external to openings 31-34 may be counter-doped to provide the conductivity and doping that is desired for the remainder of layer 27.

Figure 4:
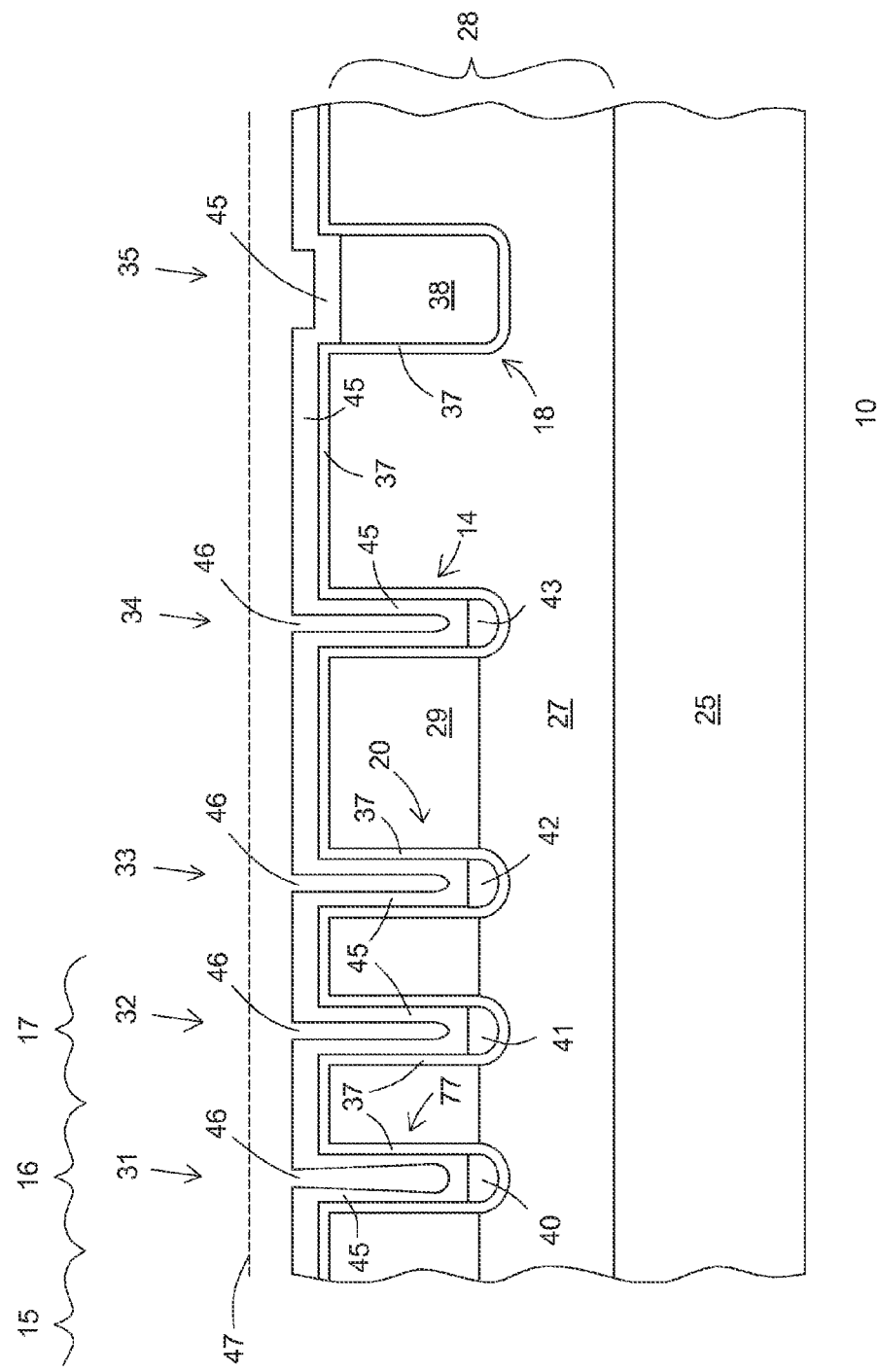

FIG. 4 illustrates a subsequent stage in an example of an embodiment of a method of forming transistor 10. A second portion of material 38 is removed from openings 31-34 leaving a third portion of material 38 near the bottom of openings 31-34 to form respective gates 40-43. Material 38 typically is not removed from opening 35 of structure 18, although it may also be removed in other embodiments. In one embodiment, the portion of material 38 is removed by applying and patterning a mask, not shown, to expose openings 31-34 but not opening 35, and etching the exposed material 38. In some embodiments, a protective layer may be included above material 78 in the event that excessive portions of insulator may be removed while removing the second portion of material 78. The protective layer may include a layer of silicon nitride or other protective material. The bottom of gates 40-43 may be no less than coplanar to the bottom of region 29 to facilitate forming the lateral channel region, in other embodiments at least the curved portion of the bottom of gates 40-43 extends into layer 27. In the preferred embodiment a portion of a sidewall of gates 40-43 are formed to extend further into layer 27 than the bottom of region 29.

Subsequently, a shield insulator 45 is formed in openings 31-34 and overlying respective gates 30-43 so that a portion of insulator 45 is between gates 40-43 and shield conductors 48-51 (see FIG. 1). The thickness of insulator 45 typically is greater than the thickness of insulator 37 so that the thickness of the insulator between gates 40-43 and shields 48-51 (FIG. 1) is thicker than the thickness of the gate insulator portion of insulator 37 that underlies gates 40-43 or the portion of insulator 37 on which gates 40-43 are formed. In another embodiment, the thickness of insulator 45 may be formed to have a thickness near the surface of region 29 and to decrease in thickness as insulator extends into region 29 toward one of or each of gates 40-43. One example embodiment is illustrated by gate structure 77, identified in a general manner by an arrow. The tapering of insulator 45 will assist in selecting the doping concentration of layer 27 to achieve low Rdson. For example, insulator 45 may be tapered to have a thickness that decreases for at least a portion of a distance that insulator 45 extends into region 29 or into opening 31. In other embodiments, the width of opening 31 may be formed to narrow as opening 31 extends into region 29. Although structure 77 is illustrated to have a taper that extends away from a straight line at an angle, the taper could have various other shapes. For example, the taper may extend as a series of steps with rounded or rectangular corners, or may extend away with a curved shape. Additionally, the opening within insulator 45 may have a different shape such as closer to having straight sidewalls within the opening. In such an embodiment, the sidewalls of opening 31 may have a similar taper so that the opening within insulator 45 has straighter sidewalls or the thickness of insulator 37 may taper, or insulator 37 may be omitted. The shape of insulator 45 within opening 31 optionally may be used for any of insulators 45. In another embodiment, the sidewalls of structure 77 may be formed to slope such as in a "V" shape or a "V" shape with a flattened bottom other shape where the sidewalls extend away from the surface of region 29 at an angle other than ninety (90) degrees. Although this optional embodiment is illustrated only in FIG. 4, it may be maintained as the shape of any or all of insulators 45 for resulting transistor 10.

Forming insulators 37 and 45 in different steps facilitates forming insulator 45 with a greater thickness than insulator 37. In other embodiments, insulator 45 may not be thicker than insulator 37. Insulator 45 usually is also formed on material 38 in opening 35. In the preferred embodiment, insulator 45 is formed by depositing a layer of tetraethyl orthosilicate glass (TEOS). Insulator 45 is formed on gates 40-43 and along the sidewalls of openings 31-34 leaving an opening 46 in insulator 45. In other embodiments, insulator 45 may be formed by other techniques such as forming an insulator in the openings and then etching opening 46 within the insulator. In other embodiments, insulator 45 may not be formed along the entire remaining length of the sidewalls of the openings.

Figure 5:
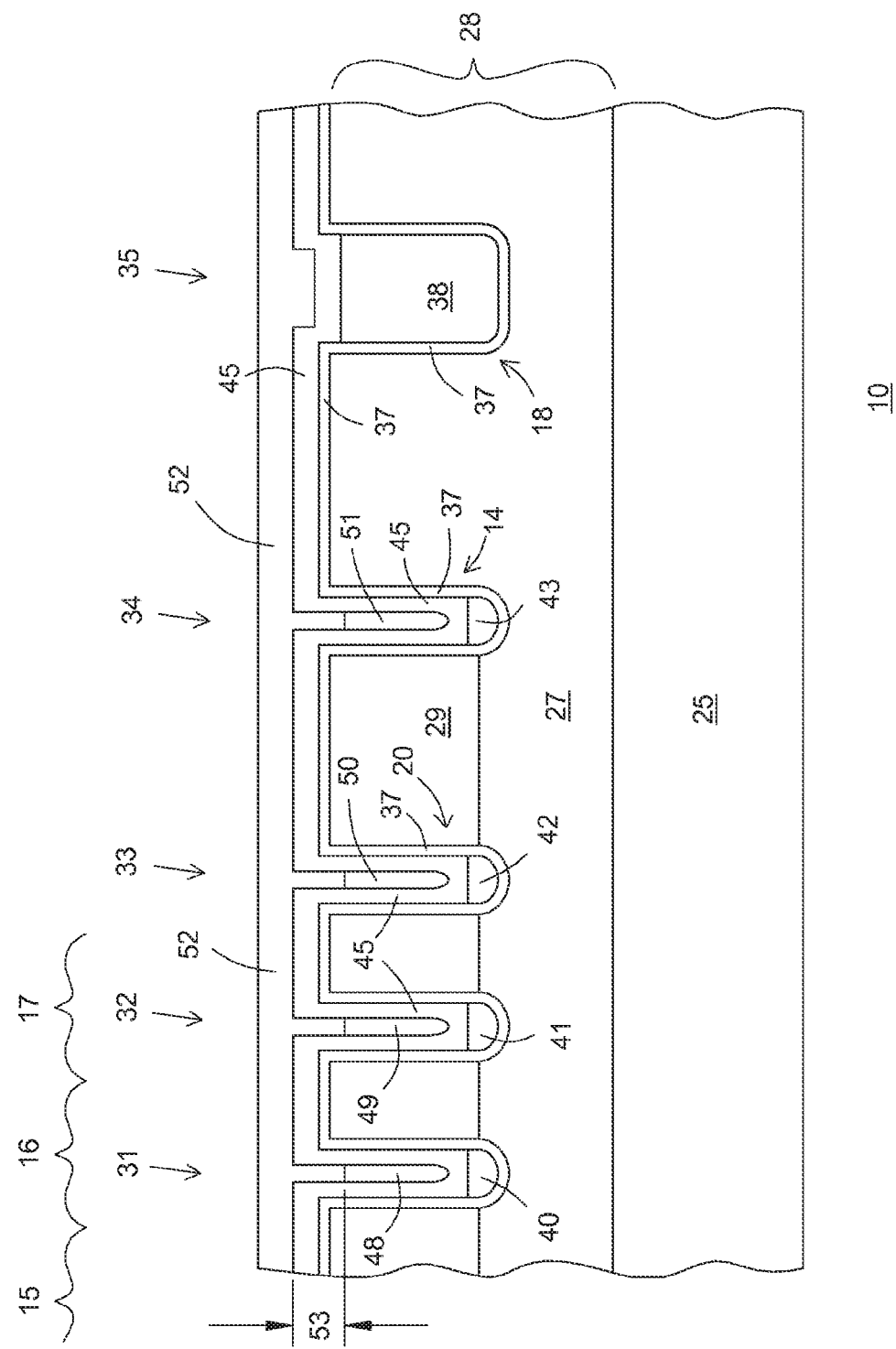

FIG. 5 illustrates transistor 10 at a subsequent stage in an example of an embodiment of a method of forming transistor 10. Shield conductors 48-51 are formed within openings 46 above respective gates 40-43. In one embodiment, a layer of doped polysilicon is formed on insulator 45 and within openings 46 (such as illustrated by dashed line 47 in FIG. 3). Subsequently, the polysilicon may be removed from the surface of transistor 10 and a portion of the polysilicon material within openings 46 may also be removed thereby recessing the top of conductors 48-51 a distance 53 below the surface of insulator 45. The polysilicon may be removed by CMP or masking and etching or other techniques. Typically, the top of conductors 48-51 is at least no higher than the surface of layer 27 but may be other heights in other embodiments. Subsequently, another insulator 52 may be formed in the remainder of openings 46 and on conductors 48-51 to cap the top of and insulate the top of conductors 48-51. Insulator 52 usually is also formed over opening 35.

Figure 6:
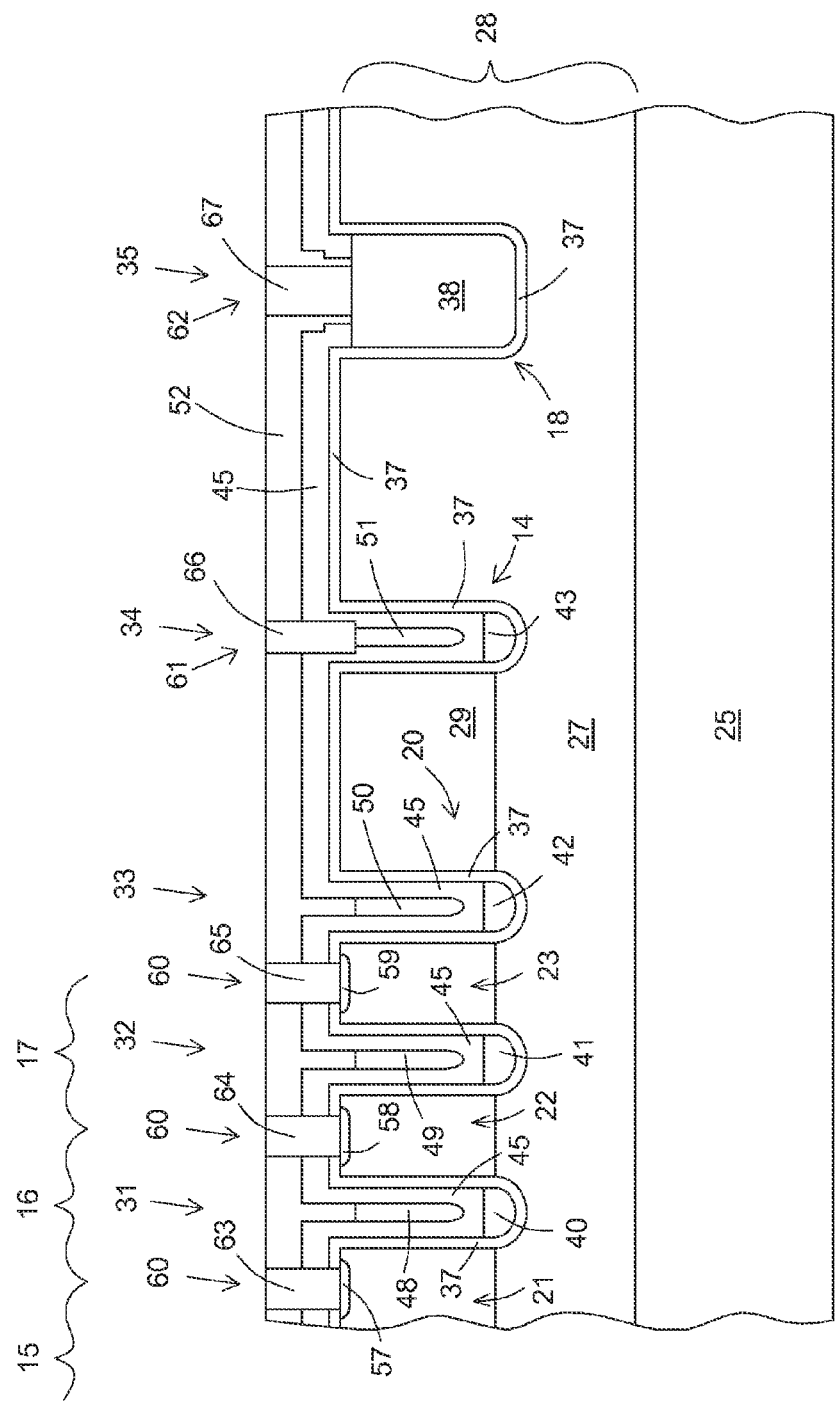

FIG. 6 illustrates transistor 10 at another subsequent stage in an example of an embodiment of a method of forming transistor 10. Transistor 10 is prepared for forming contact areas within regions 21-23 to facilitate forming low resistance ohmic contacts to regions 21-23 and conductors for regions 21-23. Source/drain openings 60 are formed between the cells to expose a portion of the surface of region 29 between openings 31-33. Additionally a shield contact opening 61 may be formed overlying shield 51 to expose a portion of shield 51. Further, a gate contact opening 62 may be formed overlying material 38 in structure 18 to expose a portion of material 38. In the preferred embodiment, a portion of insulators 52, 45, and 37 are removed in-between openings 31-33 to form openings 60 and expose the surface of region 29. In one embodiment, a mask not shown, may be applied and patterned to expose the portion of insulator 52 that is between openings 32-33 and/or overlying structures 14 and 18. The mask opening may overlie a portion of insulator 52 and may also overlie a portion of insulators 37 and 45 that is between shield conductors 48-50. The exposed portion of insulators 52, 45, and 37 are removed to form openings 60-62. Openings 60 expose the surface of region 29.

CCE contact areas are formed in the surface of region 29 that is exposed by openings 60. Typically, the exposed surface of region 29 is doped to form doped areas 57-59 in order to form low resistance ohmic electrical connections between the material of regions 21-23 and conductors that are to be formed on areas 57-59.

Conductor material is applied to doped areas 57-59 to form CCE conductors 63-65 on areas 57-59, respectively. Additionally, a shield electrode conductor 66 may be formed on shield 57 to make a low resistance electrical connection to shield 51. Since shield 51 may eventually make electrical connection to shields 48-50, shield electrode conductor 66 also makes a low resistance electrical connection to all of shields 48-50. In some embodiments, shield 51 also forms an electrical connection to the body region portion of layer 27 such as along the lateral extension of shield 51. For example, a portion of insulators 37 and 45 may be omitted from the lateral extension of shield 51 to allow shield 51 to abut a portion of layer 27 along the lateral extension. Additionally, a gate electrode conductor 67 may be formed on material 38 of structure 18 to make a low resistance electrical connection to material 38. Since material 38 may eventually make electrical connection to gates 40-42, gate electrode conductor 67 also makes a low resistance electrical connection to all of gates 40-42.

In one embodiment, conductors 63-67 are formed by applying a layer of conductor material within openings 60-62 and removing the conductor from the surface of insulator 52. The material may be removed by chemical-mechanical polishing (CMP) operations or other well known operations such as etching. In the preferred embodiment the conductor material is tungsten, but may be other materials in other embodiments such as aluminum or copper or silicide.

Referring back to FIG. 2, terminal conductors may be formed to facilitate electrically connecting CCE regions 21-22 to external terminals of a package that houses transistor 10. For example, additional conductors may be formed to electrically connect to conductors 63-67, such as is illustrated by dashed lines. Those additional conductors may be similar to what is often referred to as first level metal or a multi-layer metal interconnect structure.

In another embodiment, transistor 10 may be formed to have unequal doping profiles for regions 21-23 which provides unequal breakdown voltages for both directions of the bi-directional operation of transistor 10. For example, a mask may be formed over region 22, and an additional implant might be done in regions 21 and 23, to increase the doping of regions 21 and 23. In this case, when transistor 10 is operated in a direction, such that regions 21 and 23 act as the drain, it will have a lower breakdown voltage, than in the case when it is operated in a direction where region 22 acts as the drain.

Transistor 10 is devoid of a shield conductor underlying any of gates 40-42 or positioned between any of gates 40-42 and the underlying channel region. In one embodiment, transistor 10 is formed to have substantially equal doping profiles for regions 21-23 which provides substantially symmetrical breakdown voltages for both directions of the bi-directional operation of transistor 10. Transistor 10 is also formed to have lateral current flow in a channel region of transistor 10. This configuration assists in providing transistor 10 with a high operating frequency but still with a low Rdson. Additionally, the gate structures have a gate conductor underlying a shield conductor but still overlying the lateral channel region which improves the manufacturability of transistor 10 and reduces the costs. The separate shield insulator facilitates increasing the shield insulator thickness as the distance from the gate conductor increases. Each CCE region, such as regions 21-23, is formed in-between a shield conductor, such as shields 48-50, which allows the body region to have a higher doping concentration and lower resistivity which reduces the Rdson of transistor 10. The lateral current flow formed by the channel-to-gate configuration also improves the switching speed and lowers the channel resistance of transistor 10.

In another embodiment, transistor 10 may be formed to have an even lower Rdson by omitting the portion of insulator 45 that is shown between gates 40-43 and shields 48-51 such that shields 48-51 are electrically connected to gates 40-43, respectively. This configuration may reduce the Rdson but also may lower the switching frequency of transistor 10.

Figure 7:
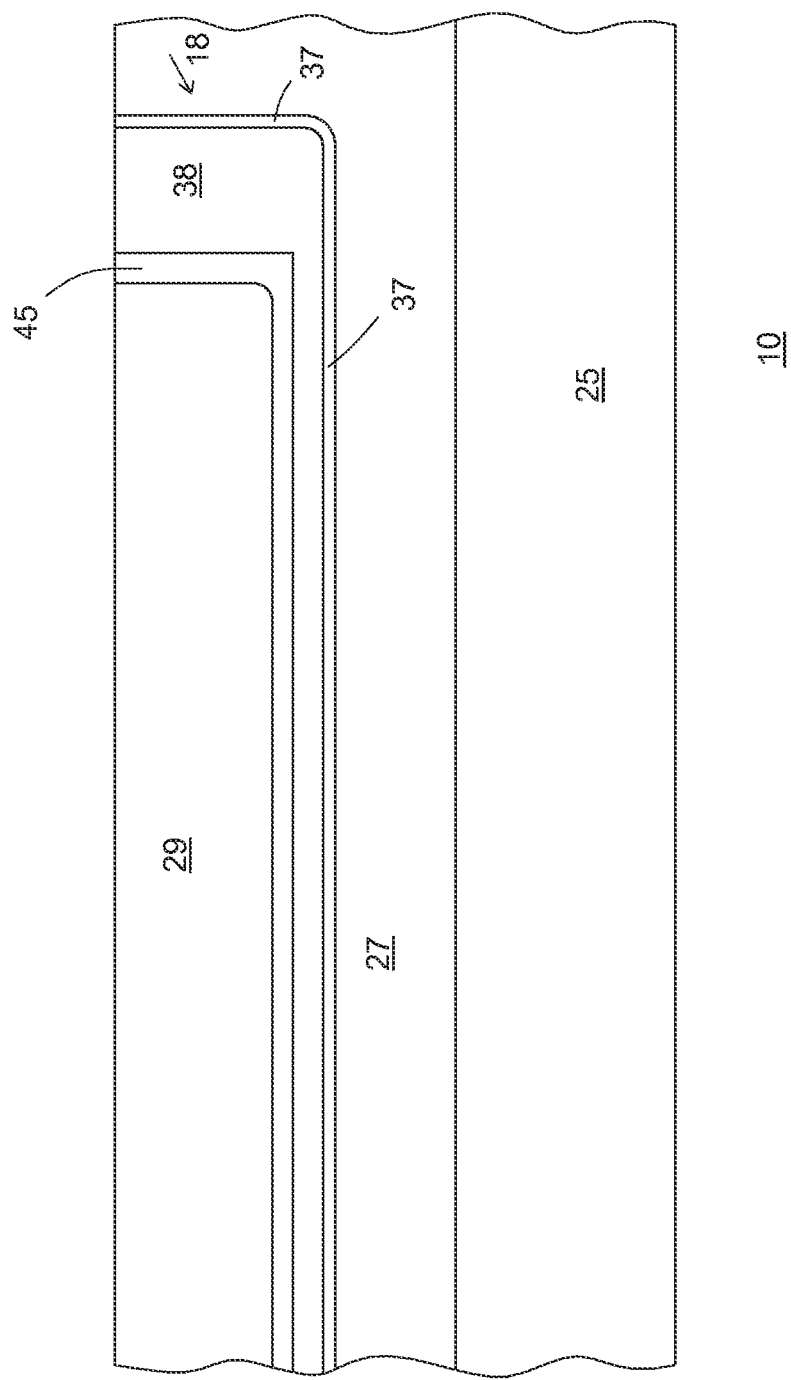
FIG. 7 illustrates an enlarged cross-sectional view of the transistor of FIG. 2 taken across a different portion of the transistor in accordance with the present invention.

FIG. 7 illustrates an enlarged cross-sectional view of transistor 10 taken across the length of transistor 10 that extends out of the page of FIG. 2. As explained hereinbefore in the description of FIG. 2, the material of individual gates 40-43 typically are electrically connected to material 38 of structure 18 at some point. FIG. 7 illustrates one example of an embodiment of a structure to electrically connect gates 40-43 to material 38 of structure 18. In this example embodiment, material 38 of structure 18 extends to intersect the material of gates 40-43 as illustrated by the electrical connection at the intersection of material 38 and gate 43. Those skilled in the art will appreciate that the material of gates 40-42 would extend parallel to gate 43 and also form an electrical connection therebetween, but can not be seen from this cross-section.

Those skilled in the art will appreciate that in one embodiment, a transistor may comprise: a semiconductor substrate of a first conductivity type, the semiconductor substrate having a first surface and a second surface;

a first semiconductor region, such as a region 27 for example, of the first conductivity type on the first surface of the semiconductor substrate;

a second semiconductor region, such as a region 29 for example, formed within the first semiconductor region wherein a first portion of the first semiconductor region underlies the second semiconductor region, the second semiconductor region having a second conductivity type;

a gate structure, for example a gate structure 20, formed in an opening that extends from the second semiconductor region into the first portion of the first semiconductor region wherein the opening separates the second semiconductor region into a first current carrying electrode region, region 22 for example, and a second current carrying electrode region, region 23 for example;

a gate conductor, such as conductor 41 for example, of the gate structure formed within the opening and overlying the first portion of the first semiconductor region wherein a first side of the first current carrying electrode region is adjacent one side of the gate conductor and spaced laterally from the gate conductor, such as spaced away by the distance of insulator 37 for example, and the second current carrying electrode region is adjacent a different side of the gate conductor and spaced laterally from the gate conductor;

a shield conductor, such as conductor 49 for example, overlying the gate conductor; and a shield insulator, such as insulator 45 for example, between the gate conductor and the shield conductor.

In another embodiment, the transistor may also include that the gate structure is devoid of a shield conductor underlying the gate conductor.

Another embodiment of the transistor may also include another gate structure, such as another structure 20 or structure 77, adjacent an opposite side of the first current carrying electrode region so that a shield conductor is adjacent and spaced apart from each side of the first current carrying electrode region.

In another embodiment, the transistor may also include a gate insulator between the gate conductor and the first portion of the first semiconductor region wherein a channel region of the transistor is in the first semiconductor region that is underlying the gate conductor so that current flows laterally under the gate structure between the first current carrying electrode region and the second current carrying electrode region.

Another embodiment of the transistor may include that a thickness of the gate insulator is less than a thickness of the shield insulator.

The transistor in another embodiment may include that a doping concentration of the substrate is greater than a doping concentration of the first semiconductor region.

In another embodiment the transistor may include that a doping concentration of the first current carrying electrode region is substantially equal to a doping concentration of the second current carrying electrode region.

The transistor may have another embodiment wherein the gate insulator is abuts the shield insulator.

Another embodiment of the transistor may include that the shield conductor is formed within an opening that is formed to extend into the shield insulator.

Those skilled in the art will also understand that in another embodiment a semiconductor device may comprise: a semiconductor material, such as material 27 for example, of a first conductivity type having a first surface and a second surface;

a first region, such as region 29 for example, of the semiconductor material having a second conductivity type;

a gate structure extending into the semiconductor material that is underlying the first region wherein the gate structure forms the first region into a first current carrying electrode region and a second current carrying electrode region and wherein a doping concentration of the first current carrying electrode region is substantially equal to a doping concentration of the second current carrying electrode region;

a gate conductor of the gate structure overlying at least a first portion of the semiconductor material;

a gate insulator of the gate structure having a first portion of the gate insulator positioned between the gate conductor and the first portion of the semiconductor material that underlies the gate conductor wherein the first portion of the semiconductor material is configured to form a channel region of the transistor;

a shield conductor of the gate structure overlying the gate conductor;

a shield insulator having a first portion positioned between the shield conductor and the gate conductor, the shield insulator having a second portion positioned between the shield conductor and a second portion of the gate insulator.

The semiconductor device may have another embodiment wherein the gate structure includes an opening extending from a surface of the first region into the semiconductor material with the gate insulator positioned on a bottom of the opening and the gate conductor within the opening and on the gate insulator.

Another embodiment of the semiconductor device may include that a second portion of the gate insulator is positioned along a sidewall of the opening and abutting the shield insulator.

In another embodiment, the semiconductor device may include that the shield conductor is within the opening and overlying the gate conductor.

The semiconductor device may also include another embodiment wherein a body region of the semiconductor device is not electrically connected to either the first current carrying electrode region or the second current carrying electrode region.

Those skilled in the art will appreciate that in one embodiment, a method of forming a semiconductor device may comprise: providing a multi-layer semiconductor material having a first layer, such as layer 27 for example, of a first conductivity type, having a first region, such as a region 29 for example, of a second conductivity type overlying the first layer, having a plurality of openings that extend from a surface of the first region into the first layer wherein the plurality of openings have sidewalls, a gate insulator formed on the sidewalls of a first opening of the plurality of openings, and a gate conductor material within the first opening, and wherein the plurality of openings divide the first region into a first current carrying electrode region, such as region CCE1 for example, and a second current carrying electrode region, such as region CCE2 for example;

forming a doping concentration of the first current carrying electrode region to be substantially equal to a doping concentration of the second current carrying electrode region;

forming the gate conductor material, such as material 38 for example, in the first opening into a gate conductor, conductor 41 for example, wherein a portion of the first layer that underlies the gate conductor forms a channel region of the semiconductor device;

forming a shield insulator within the first opening and overlying the gate conductor;

forming a shield conductor overlying the gate conductor; and forming a source conductor on a portion of the shield conductor to form an electrical connection between the shield conductor and the first layer.

In another embodiment, the method may include providing a semiconductor substrate of the first conductivity type and forming the first layer on a first surface of the semiconductor substrate.

Another embodiment of the method may also include providing the semiconductor substrate with a first doping concentration and forming the first layer with a doping concentration that is lower than the first doping concentration.

The method may have another embodiment including forming a body conductor on a second surface of the semiconductor substrate.

Another embodiment of the method may include forming the plurality of openings to extend from a surface of the first layer into the first layer, then doping a portion of the first layer to form the first region with the first opening within the first region.

The method may also include forming the shield insulator with a second opening within the shield insulator with at least a portion of the second opening extending substantially parallel to the sidewalls of the first opening, and forming the shield conductor within at least a portion of the second opening.

In view of all of the above, it is evident that a novel semiconductor device and method is disclosed. Included, among other features, is forming a the source and drain regions to have substantially similar doping or substantially the same doping which facilitates forming the device to have substantially the same breakdown voltage for biasing the device to have current flow in either direction. Also included is forming the transistor to have lateral current flow in the channel region which reduces the gate charge and facilitates high frequency operation and improves the switching frequency. Forming a shield conductor on each side of the source and drain regions reduces the charge in the channel region which allows higher doping in the channel region which reduces the Rdson. Forming the thickness of the shield insulator to increase for greater distance away from the gate conductor allows a higher doping concentration in regions 29 for a given breakdown voltage, which reduces the Rdson. Forming the channel region and the substrate to have the same conductivity type reduces the body contact resistance which increases the avalanche energy capability of the device, and reduces the manufacturing costs. Forming a body contact conductor on one surface of the substrate also reduces the body contact resistance. Forming the shield conductor to electrically contact the body of transistor 10 keeps the shield at the same potential as the body of the transistor. This assists in depleting the portion of region 29 that forms the drain region for the cell(s) which is(are) acting as the drain(s) of transistor 10.

While the subject matter of the descriptions are described with specific preferred embodiments and example embodiments, the foregoing drawings and descriptions thereof depict only typical and/or examples of embodiments of the subject matter and are not therefore to be considered to be limiting of its scope. It is evident that many alternatives and variations will be apparent to those skilled in the art. Although the devices are described as silicon semiconductor devices, those skilled in the art understand that at least some elements herein, such as the gate structures, are also applicable to devices using other semiconductor materials such as gallium nitride (GaN).

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

What is claimed is:

1. A transistor comprising:
a semiconductor substrate of a first conductivity type, the semiconductor substrate having a first surface and a second surface;
a first semiconductor region of the first conductivity type on the first surface of the semiconductor substrate;
a second semiconductor region formed within the first semiconductor region wherein a first portion of the first semiconductor region underlies the second semiconductor region, the second semiconductor region having a second conductivity type;
a gate structure formed in an opening that extends from the second semiconductor region into the first portion of the first semiconductor region wherein the opening separates the second semiconductor region into a first current carrying electrode region and a second current carrying electrode region;
a gate conductor of the gate structure formed within the opening and overlying the first portion of the first semiconductor region wherein a first side of the first current carrying electrode region is adjacent one side of the gate conductor and spaced laterally from the gate conductor and the second current carrying electrode region is adjacent a different side of the gate conductor and spaced laterally from the gate conductor;
a shield conductor overlying the gate conductor; and
a shield insulator between the gate conductor and the shield conductor.

2. The transistor of claim 1 wherein the gate structure is devoid of a shield conductor underlying the gate conductor.

3. The transistor of claim 1 further including another gate structure adjacent an opposite side of the first current carrying electrode region so that a shield conductor is adjacent and spaced apart from each side of the first current carrying electrode region.

4. The transistor of claim 1 further including a gate insulator between the gate conductor and the first portion of the first semiconductor region wherein a channel region of the transistor is in the first semiconductor region that is underlying the gate conductor so that current flows laterally under the gate structure between the first current carrying electrode region and the second current carrying electrode region.

5. The transistor of claim 4 wherein a thickness of the gate insulator is less than a thickness of the shield insulator.

6. The transistor of claim 1 wherein a doping concentration of the substrate is greater than a doping concentration of the first semiconductor region.

7. The transistor of claim 1 wherein a doping concentration of the first current carrying electrode region is substantially equal to a doping concentration of the second current carrying electrode region.

8. The transistor of claim 1 wherein the gate insulator is abuts the shield insulator.

9. The transistor of claim 1 wherein the shield conductor is formed within an opening that is formed to extend into the shield insulator.

10. A semiconductor device comprising:
a semiconductor material of a first conductivity type having a first surface and a second surface;
a first region of the semiconductor material having a second conductivity type;
a gate structure extending into the semiconductor material that is underlying the first region wherein the gate structure forms the first region into a first current carrying electrode region and a second current carrying electrode region and wherein a doping concentration of the first current carrying electrode region is substantially equal to a doping concentration of the second current carrying electrode region;
a gate conductor of the gate structure overlying at least a first portion of the semiconductor material;
a gate insulator of the gate structure having a first portion of the gate insulator positioned between the gate conductor and the first portion of the semiconductor material that underlies the gate conductor wherein the first portion of the semiconductor material is configured to form a channel region of the transistor;
a shield conductor of the gate structure overlying the gate conductor;
a shield insulator having a first portion positioned between the shield conductor and the gate conductor, the shield insulator having a second portion positioned between the shield conductor and a second portion of the gate insulator.

11. The semiconductor device of claim 10 wherein the gate structure includes an opening extending from a surface of the first region into the semiconductor material with the gate insulator positioned on a bottom of the opening and the gate conductor within the opening and on the gate insulator.

12. The semiconductor device of claim 11 wherein a second portion of the gate insulator is positioned along a sidewall of the opening and abutting the shield insulator.

13. The semiconductor device of claim 11 wherein the shield conductor is within the opening and overlying the gate conductor.

14. The semiconductor device of claim 10 wherein a body region of the semiconductor device is not electrically connected to either the first current carrying electrode region or the second current carrying electrode region.

15. A method of forming a semiconductor device comprising:
providing a multi-layer semiconductor material having a first layer of a first conductivity type, having a first region of a second conductivity type overlying the first layer, having a plurality of openings that extend from a surface of the first region into the first layer wherein the plurality of openings have sidewalls, a gate insulator formed on the sidewalls of a first opening of the plurality of openings, and a gate conductor material within the first opening, and wherein the plurality of openings divide the first region into a first current carrying electrode region and a second current carrying electrode region;
forming a doping concentration of the first current carrying electrode region to be substantially equal to a doping concentration of the second current carrying electrode region;
forming the gate conductor material in the first opening into a gate conductor wherein a portion of the first layer that underlies the gate conductor forms a channel region of the semiconductor device;
forming a shield insulator within the first opening and overlying the gate conductor;
forming a shield conductor overlying the gate conductor; and
forming a source conductor on a portion of the shield conductor to form an electrical connection between the shield conductor and the first layer.

16. The method of claim 15 wherein providing the multi-layer semiconductor material includes providing a semiconductor substrate of the first conductivity type and forming the first layer on a first surface of the semiconductor substrate.

17. The method of claim 16 further including providing the semiconductor substrate with a first doping concentration and forming the first layer with a doping concentration that is lower than the first doping concentration.

18. The method of claim 16 further including forming a body conductor on a second surface of the semiconductor substrate.

19. The method of claim 15 wherein providing the multi-layer semiconductor material includes forming the plurality of openings to extend from a surface of the first layer into the first layer, then doping a portion of the first layer to form the first region with the first opening within the first region.

20. The method of claim 15 wherein forming the shield insulator within the first opening includes forming the shield insulator with a second opening within the shield insulator with at least a portion of the second opening extending substantially parallel to the sidewalls of the first opening, and forming the shield conductor within at least a portion of the second opening.

\* \* \* \* \*